United States Patent
Park et al.

(10) Patent No.: US 9,553,548 B2
(45) Date of Patent: Jan. 24, 2017

(54) LOW DROP OUT VOLTAGE REGULATOR AND METHOD THEREFOR

(71) Applicant: FREESCALE SEMICONDUCTOR, INC., Austin, TX (US)

(72) Inventors: Chang Joon Park, Austin, TX (US); Ravi C. Geetla, Austin, TX (US); Octavio A. Gonzalez, Pflugerville, TX (US)

(73) Assignee: NXP USA, INC., Austin, TX (US)

( * ) Notice: Subject to any disclaimer, the term of this patent is extended or adjusted under 35 U.S.C. 154(b) by 135 days.

(21) Appl. No.: 14/690,896

(22) Filed: Apr. 20, 2015

(65) Prior Publication Data

US 2016/0308497 A1    Oct. 20, 2016

(51) Int. Cl.
  H03F 1/00    (2006.01)
  H03F 1/26    (2006.01)
  H03F 3/45    (2006.01)
  G05F 1/625   (2006.01)

(52) U.S. Cl.
  CPC .............. *H03F 1/26* (2013.01); *G05F 1/625* (2013.01); *H03F 3/45076* (2013.01); *H03F 2200/372* (2013.01); *H03F 2203/45051* (2013.01)

(58) Field of Classification Search
  CPC .......... G05F 1/575; G05F 1/467; G05F 3/242; H02M 1/15; H02M 1/44; H02M 2001/0025; H02M 3/156; H03F 1/086; H03F 3/3023
  See application file for complete search history.

(56) References Cited

U.S. PATENT DOCUMENTS

| | | | |
|---|---|---|---|
| 5,982,226 A | 11/1999 | Rincon-Mora | |
| 6,208,206 B1* | 3/2001 | Leung | H03F 1/086 330/100 |
| 7,495,422 B2* | 2/2009 | Mok | G05F 1/575 323/280 |
| 2004/0169550 A1* | 9/2004 | Perrier | G05F 1/575 327/541 |
| 2008/0191670 A1 | 8/2008 | Oddoart et al. | |
| 2008/0303496 A1* | 12/2008 | Schlueter | G05F 1/575 323/273 |
| 2010/0097047 A1 | 4/2010 | Kimura | |
| 2013/0027011 A1* | 1/2013 | Shih | G05F 1/467 323/282 |
| 2014/0176098 A1* | 6/2014 | Fang | G05F 1/575 323/280 |

OTHER PUBLICATIONS

Wang et al, "A Linear LDO Regulator with Modified NMCF Frequency Compensation Independent of Off-chip Capacitor and ESR", IEEE Asia Pacific Conference on Circuits and Systems, Dec. 4-7, 2006, pp. 880-883.

* cited by examiner

*Primary Examiner* — Adolf Berhane
*Assistant Examiner* — Henry Lee, III

(57) ABSTRACT

A circuit and method for regulating an output voltage are provided. The circuit includes a fully differential first stage amplifier, a second stage amplifier, and a power output driver transistor. The first stage amplifier receives a reference voltage and feedback voltage relative to an output voltage of the power output driver transistor. A differential output of the first stage amplifier is received at differential inputs of the second stage amplifier. The second stage amplifier provides a voltage at a control terminal of the power transistor. The output voltage of the power transistor is based on the voltage at the control terminal and a supply voltage coupled to the power output driver transistor.

20 Claims, 2 Drawing Sheets

LOW DROP OUT VOLTAGE REGULATOR AND METHOD THEREFOR

BACKGROUND

Field

This disclosure relates generally to electronic circuits, and more specifically, to a low drop-out voltage regulator and method therefor.

Related Art

A low drop out (LDO) voltage regulator is used to provide a stable power supply voltage that does not fluctuate much in response to a changing load. The drop out voltage is the difference in voltage between the power supply and the lowest regulated output voltage. Low drop out voltage regulators are commonly used in battery powered applications.

Many systems-on-a-chip (SoC) integrated circuit applications include analog and radio frequency (RF) circuits and digital circuits on the same integrated circuit. The transistor switching of the digital circuits can cause the power supply to be very noisy while the analog and RF circuits may be sensitive to the power supply noise. Therefore, the analog and RF circuits should be provided with a very clean power supply voltage to avoid performance degradations.

A LDO regulator may include an error amplifier, power output driver, feedback resistive network, and output capacitor. A Miller compensation capacitor has been used to in LDO regulators to provide stability. However, some Miller compensation techniques may require a capacitor to be integrated on-chip. On-chip capacitors of sufficient capacitance may require a substantial surface area of the integrated circuit, thus increasing cost of the integrated circuit. Also, the use of Miller compensation capacitors may cause the LDO regulator to react slowly to changes in the load and increase output voltage glitches and settling time.

One of the main sources of noise in the LDO regulator is caused by power supply noise coupling through the error amplifier, band-gap reference, and the power output driver. If the error amplifier does not have good power supply noise rejection, the error amplifier can degrade the performance the entire regulator. Also, the error amplifier should provide high gain while providing good power supply noise rejection.

Therefore, a need exists for a LDO voltage regulator that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
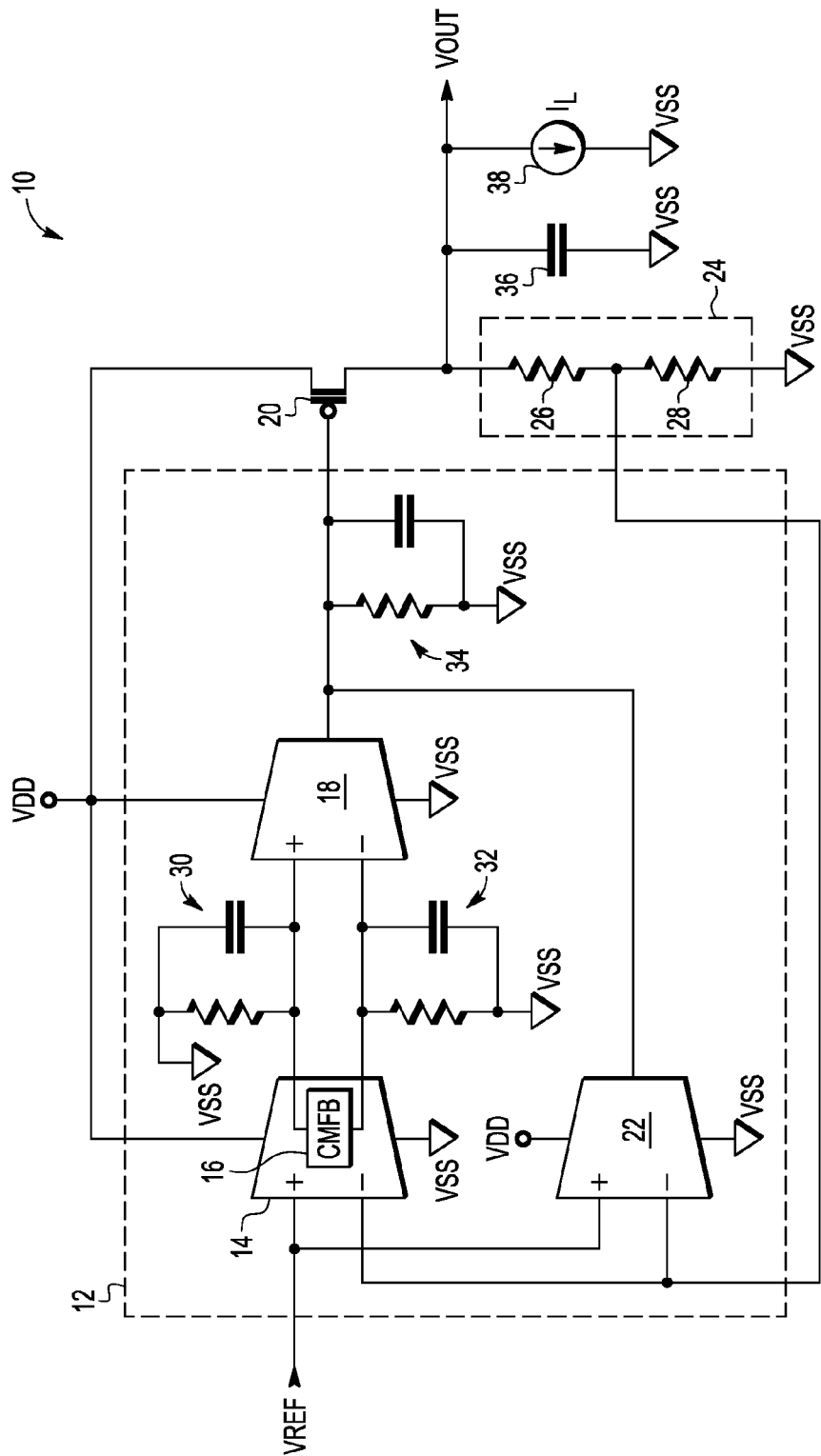
FIG. 1 illustrates, in partial block diagram form and partial schematic diagram form, an LDO voltage regulator circuit in accordance with an embodiment.

Generally, there is provided, an LDO voltage regulator circuit that includes a first stage amplifier, a second stage amplifier, a feed-forward (FF) amplifier, and a power output driver. There is a feedback path from the power output driver to the first stage amplifier. The first stage amplifier also includes a common-mode feedback circuit (CMFB). The first stage amplifier is fully differential, that is, the first stage amplifier includes a differential input and a differential output. The second stage amplifier and the feed-forward amplifier each has a differential input and a single-ended output. The use of a fully differential first stage amplifier with a common-mode feedback circuit cancels power supply noise. The feed-forward amplifier stage is in parallel with the first stage amplifier and is used instead of Miller compensation to eliminate the large on-chip capacitor. Also, the feed-forward amplifier stage improves transient response, and reduces output voltage glitches and settling time as compared to a Miller compensated LDO voltage regulator.

In one embodiment, there is provided, a circuit comprising: a first stage amplifier having a first input coupled to receive a reference voltage, a second input, a first output, and a second output; a second stage amplifier having a first input coupled to the first output of the first stage amplifier, a second input coupled to the second output of the first stage amplifier, and an output; a feed-forward amplifier having a first input coupled to receive the reference voltage, a second input, and an output coupled to the output of the second stage amplifier; a transistor having a control terminal coupled to the output of the second stage amplifier and to the output of the feed-forward amplifier, a first current terminal coupled to an output voltage terminal and a second current terminal coupled to a first voltage supply; a first resistive element having a first terminal coupled to the output voltage terminal and a second terminal coupled to the second input of the first stage amplifier and to the second input of the feed-forward amplifier; and a second resistive element having a first terminal coupled to the second terminal of the first resistive element and a second terminal coupled to a second voltage supply. The first stage amplifier may be characterized as a fully differential operational amplifier having a differential input, a differential output, and common-mode feedback. The common-mode feedback may further comprise: a first resistor having a first terminal and a second terminal, the first terminal coupled to the first output of the first stage amplifier; and a second resistor having a first terminal and a second terminal, the first terminal coupled to the second output of the first stage amplifier; wherein the second terminal of the first resistor is coupled to the second terminal of the second resistor and coupled to a current source in the output stage of the first stage amplifier. The second stage amplifier may be characterized as a differential operational amplifier having a differential input and a single ended output. The circuit may further comprise a current load coupled between the output voltage terminal and the second voltage supply. The circuit may further comprise a capacitor having a first terminal coupled to the output voltage terminal and a second terminal coupled to the second voltage supply. The first voltage supply may be characterized as a positive power supply voltage and the second voltage supply may be characterized as ground. The feed-forward amplifier may be characterized as an operational amplifier having a differential input and a single ended output. The second stage amplifier and the feed-forward amplifier may share a common output stage. The transistor may be a P-channel transistor. The circuit may further comprise a bias circuit for providing a bias voltage to the first stage amplifier, the second stage amplifier, and the feed-forward amplifier. The first resistive element may include a first plurality of series-connected resistors and the second resistive element includes a second plurality of series-connected resistors.

In another embodiment, there is provided, a circuit comprising: a first stage amplifier having a first input coupled to receive a reference voltage, a second input, a first output, and a second output; a second stage amplifier having a first input coupled to the first output of the first stage amplifier, a second input coupled to the second output of the first stage amplifier, and an output; a transistor having a control terminal coupled to the output of the second stage amplifier, a drain terminal coupled to an output voltage terminal and a source terminal coupled to a first voltage supply; a first resistive element having a first terminal coupled to the output voltage terminal and a second terminal coupled to the second input of the first stage amplifier; and a second resistive element having a first terminal coupled to the second terminal of the first resistive element and a second terminal coupled to a second voltage supply. The circuit may further comprise a series-connected capacitor and resistor, the series-connected capacitor and resistor coupled between the output of the second stage amplifier and the output voltage terminal. The circuit may further comprise a feed-forward amplifier having a first input coupled to receive the reference voltage, a second input coupled to second terminal of the first resistive element, and an output coupled to the output of the second stage amplifier. The first resistive element may include a first plurality of series-connected resistors and the second resistive element includes a second plurality of series-connected resistors. The first stage amplifier may be characterized as a fully differential operational amplifier having a differential input, a differential output, and common-mode feedback. The common-mode feedback may further comprise: a first resistor having a first terminal and a second terminal, the first terminal coupled to the first output of the first stage amplifier; and a second resistor having a first terminal and a second terminal, the first terminal coupled to the second output of the first stage amplifier; wherein the second terminal of the first resistor is coupled to the second terminal of the second resistor and coupled to a current source in the output stage of the first stage amplifier.

In yet another embodiment, there is provided, a method of regulating an output voltage comprising: receiving a reference voltage at a first input of a first stage amplifier, the first stage amplifier having a second input, and providing a differential output; receiving the differential output of the first stage amplifier at differential inputs of a second stage amplifier, the second stage amplifier providing a single-ended output voltage; receiving the second stage amplifier output voltage at a control terminal of a transistor, the transistor having a first terminal coupled to a first voltage supply and at a second terminal providing an output voltage based on the control terminal voltage and the first voltage supply; and feeding back a feedback voltage to the second input of the first stage amplifier, the feedback voltage being relative to the output voltage at the second terminal of the transistor. The method may further comprise: receiving the reference voltage at a first input of a feed-forward amplifier; receiving the feedback voltage at a second input of the feed-forward amplifier; and coupling an output of the feed-forward amplifier with an output of the second stage amplifier.

FIG. 1 illustrates, in partial block diagram form and partial schematic diagram form, an LDO voltage regulator circuit 10 in accordance with an embodiment. In one embodiment, LDO voltage regulator circuit 10 is implemented entirely on an integrated circuit. In another embodiment, one or more components may be external to LDO voltage regulator 10. Low drop-out voltage regulator 10 includes error amplifier 12 and voltage divider 24. Error amplifier 12 includes first stage amplifier 14, second stage amplifier 18, and feed-forward amplifier 22. First stage amplifier 14 includes common-mode feedback (CMFB) circuit 16. In one embodiment, first stage amplifier 14 is a fully differential operational amplifier and second stage amplifier 18 and feed-forward amplifier 22 may each be an operational amplifier with differential inputs and a single-ended output. Resistor capacitor combinations 30 and 32 represent the inherent impedances of the differential output of first stage amplifier 14. Likewise, impedance 34 represents the combined inherent output impedances for the second stage amplifier 18 and feed-forward amplifier 22. Voltage divider 24 includes series-connected resistances 26 and 28.

Each of amplifiers 14, 18, and 22 are coupled to a power supply voltage terminal labeled "VDD", and to a power supply voltage terminal labeled "VSS". In one embodiment, VDD is coupled to receive a positive power supply voltage and VSS is coupled to ground. In another embodiment, the power supply voltage may be different. First stage amplifier 14 has a first input terminal labeled with a plus sign "+" for receiving a reference voltage labeled "VREF", a second input terminal labeled with a minus sign "−", a first output terminal and a second output terminal. The first and second input terminals of first stage amplifier 14 receive a differential input signal and the first and second output terminals provide a differential output signal. In accordance with the described embodiment, a differential signal includes two signals that are complementary, or the inverse of each other.

Second stage amplifier 18 has a first input terminal labeled with a plus sign "+" connected to the first output terminal of first stage amplifier 14, a second input terminal labeled with a minus sign "−" connected to the second output terminal of first stage amplifier 14, and a single-ended output terminal. The first and second input terminals of second stage amplifier 18 receive the differential output signal provided by first stage amplifier 14. Feed-forward amplifier 22 has a differential input comprising first and second input terminals, the first input terminal, labeled with a plus sign, is coupled to receive reference voltage VREF, and the second input terminal labeled with a minus sign and connected to the second input terminal of first stage amplifier 14. Note that second stage amplifier 18 and feed-forward amplifier 22 each has a differential input but do not receive differential input signals in the described embodiment. An output terminal of feed-forward amplifier 22 is connected to the output terminal of second stage amplifier 18. Note that the outputs of second stage amplifier 18 and feed-forward amplifier 22 are single-ended.

P-channel transistor 20 functions as an output driver and has a source connected to power supply voltage terminal VDD, a gate connected to the output of second stage amplifier 18, and a drain connected to provide an output voltage labeled "VOUT". In another embodiment, transistor 20 may be an N-channel transistor.

Resistor divider 24 includes series-connected resistors 26 and 28 connected between the output terminal VOUT and VSS. In one embodiment, the feedback voltage is adjustable (not shown) by the user by implementing divider 24 as a plurality of resistive elements with a plurality of output taps. Each of resistors 26 and 28 may include a plurality of series-connected resistances. A control signal (not shown) may be used to select an output tap. The selected output tap is connected to the second input terminal of first stage amplifier 14. Output capacitance 36 is an externally provided capacitance connected between the output terminal VOUT and VSS. Current sink 38 provides a load current labeled "IL" representative of a current provided by a load coupled to output terminal VOUT. In another embodiment, current sink 38 may be a current source.

In operation, LDO regulator 10 provides output voltage VOUT at a voltage level determined by the voltage level of reference voltage VREF. In one embodiment, reference voltage VREF may be based on a bandgap reference voltage. The bandgap reference voltage is equal to about 1.25 volts and is based on the bandgap of silicon. The bandgap reference voltage is independent of changes in temperature and power supply voltage. In another embodiment, VREF may be generated differently. The differential inputs of first stage amplifier 14 receive reference voltage VREF and a feedback voltage from divider 24, and provide a differential output voltage to the differential inputs of second stage amplifier 18. The common-mode feedback circuit 16 sets the common-mode of the first stage amplifier differential output. The common-mode of a differential signal is the crossing point voltage when the two signals of the differential signal cross each other during transitions from one voltage level to another.

Power supply noise is canceled in the first stage amplifier 14 because the power supply noise affects both outputs of the first stage amplifier the same way. A pole at the output of first stage amplifier 14 is compensated for by a left half plane (LHP) zero determined by input transconductances of the first stage amplifier 14, second stage amplifier 18, and feed-forward stage amplifier 22, and the parasitic output capacitance of the first stage amplifiers 30 and 32. Therefore, the power supply rejection ratio (PSRR) is improved. The output of second stage amplifier 18 biases the gate of P-channel transistor 20. LDO regulator circuit 10 attempts to make the feedback voltage from feedback resistor network 24 be the same level as the reference voltage VREF. Feed-forward amplifier 22 is connected in parallel with the first and second stage amplifiers 14 and 18, and stabilizes the bias voltage provided to the gate of P-channel transistor 20. In another embodiment, Miller compensation may be used instead of feed-forward amplifier 22. However, for a given phase margin, feed-forward amplifier 22 provides an advantage over Miller compensation of improved transient response and reduced output voltage glitches and settling time due to higher gain-bandwidth. Also, a large Miller capacitor may require a large surface area on an integrated circuit to implement.

Figure 2:
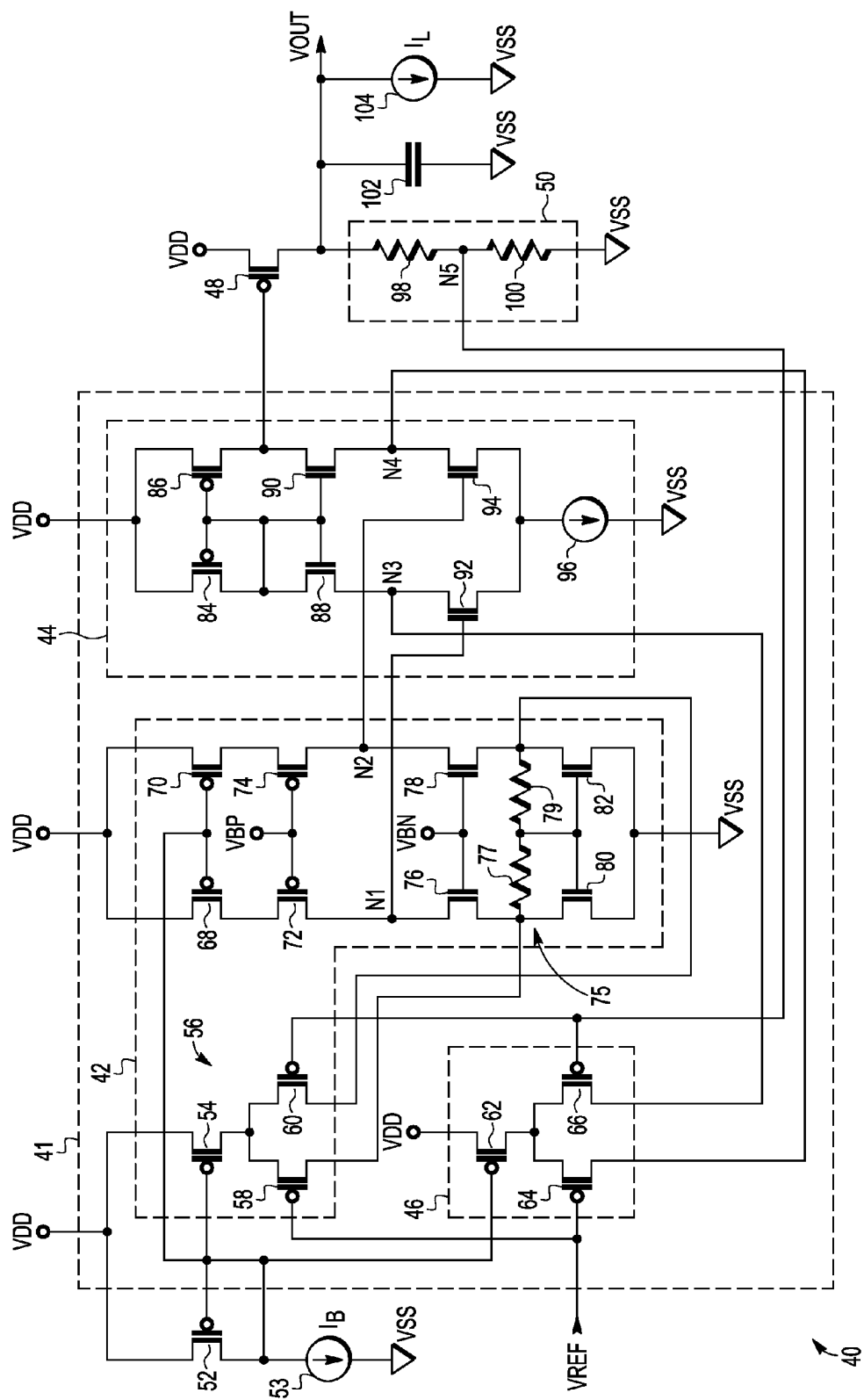
FIG. 2 illustrates, in schematic diagram form, an LDO voltage regulator circuit in accordance with an embodiment.

FIG. 2 illustrates, in schematic diagram form, LDO voltage regulator 40 in accordance with an embodiment. LDO voltage regulator 40 includes error amplifier 41, P-channel transistor 48, P-channel transistor 52, current sink 53, and feedback resistor network 50. Error amplifier 41 includes first stage amplifier 42, second stage amplifier 44, and feed-forward input stage 46.

P-channel transistors 52, 54, 68, and 70 are connected together to form a current mirror. Current sink 53 provides a current labeled "IB" for supplying the current mirror with a reference current. First stage amplifier 42 includes a differential pair 56, P-channel transistors 68, 70, 72, and 74, N-channel transistors 76, 78, 80, and 82, and a common-mode feedback circuit (CMFB) 75. Differential pair 56 includes P-channel transistors 58 and 60 coupled between a P-channel transistor 54 and common-mode circuit 75. P-channel transistor 58 is coupled to receive reference voltage VREF. P-channel transistor 60 is coupled to node N5 between resistors 98 and 100 of feedback resistor network 50. P-channel transistor 58 has a drain connected to resistor 77 and P-channel transistor 60 has a drain connected to resistor 79. Common-mode circuit 75 includes resistors 77 and 79. A connection between resistors 77 and 79 is connected to the gates of N-channel transistors 80 and 82. A voltage provided by common-mode circuit 75 biases transistors 80 and 82 to control a center voltage, or crossing voltage, of the differential output voltage at nodes N1 and N2 of first stage amplifier 42. In another embodiment, a common-mode circuit may include active elements such as transistors connected together as a differential amplifier. P-channel transistors 68 and 70 are connected together as current mirrors with P-channel transistor 52. P-channel transistors 72 and 74 each have a source coupled to drains of P-channel transistors 68 and 70, and P-channel transistors 72 and 74 have drains coupled to nodes N1 and N2, respectively. The gates of P-channel transistors 72 and 74 receive a bias voltage labeled "VBP" and the gates of N-channel transistors 76 and 78 receive a bias voltage labeled "VBN".

Second stage amplifier 44 has differential inputs at nodes N1 and N2 and a single-ended output connected to the gate of P-channel transistor 48. Second stage amplifier 44 includes P-channel transistors 84 and 86, and N-channel transistors 88, 90, 92, and 94. P-channel transistors 84 and 86 have sources coupled to VDD, gates coupled to the drain of P-channel transistor 84, and drains coupled to drains of N-channel transistors 88 and 90. N-channel transistors 88 and 90 have gates coupled to the gates of P-channel transistors 84 and 86, and drains coupled to nodes N3 and N4. N-channel transistor 92 has a gate connected to node N1 of first stage amplifier 42 and N-channel transistor 94 has a gate connected to node N2 of first stage amplifier 42. Sources of N-channel transistors 92 and 94 are connected to a first terminal of current sink 96, and drains are coupled to nodes N3 and N4, respectively. Current sink 96 has a second terminal connected to VSS. In the illustrated embodiment, power supply voltage terminal VDD is coupled to a positive power supply voltage and power supply terminal VSS is coupled to ground.

Feed-forward input stage 46 includes P-channel transistors 64 and 66 connected together as a differential pair. The drains of P-channel transistors 64 and 66 are connected to differential nodes N3 and N4 of second stage amplifier 44. The drains of P-channel transistor 86 and N-channel transistor 90 form the single-ended output of second stage amplifier 44.

P-channel transistor 48 has a source connected to VDD, a gate connected to the drains of P-channel transistor 86 and N-channel transistor 90, and a drain connected to output terminal VOUT. Feedback resistor network 50 includes series-connected resistors 98 and 100 shown simply as a voltage divider in the illustrated embodiment. In other embodiments, feedback resistor network 50 may include a plurality of series-connected resistors having a plurality of selectable voltage taps. The plurality of taps may be used by, for example, a user to adjust the output voltage VOUT. An output capacitor 102 is provided external to an integrated circuit having regulator 40. A current sink 104 is representative of a load current provided by a circuit coupled to receive output voltage VOUT.

Low drop out voltage regulator 40 will provide output voltage VOUT at a voltage level determined by the voltage level of reference voltage VREF. In one embodiment, reference voltage VREF is based on a bandgap voltage. In another embodiment reference voltage VREF may be generated differently. The current mirror circuit made up of P-channel transistors 52 and 54 and current sink 53 set the current to differential pair 56. The differential pair 56 of first stage amplifier 42 includes P-channel transistors 58 and 60. P-channel transistor 58 receives reference voltage VREF and P-channel transistor 60 receives a feedback voltage from feedback resistor network 50.

First stage amplifier 42 is fully differential. The gates of P-channel transistors 58 and 60 are differential inputs for first stage amplifier 42. Nodes N1 and N2 are differential output terminals for first stage amplifier 42. P-channel transistors 72 and 74 receive a bias voltage labeled "VBP" and N-channel transistors 76 and 78 receive a bias voltage labeled "VBN". Transistors 72, 74, 76, and 78 function as cascade devices for first stage amplifier 42. The common-mode feedback circuit 75 includes resistors 77 and 79 and sets the common mode of the differential output of first stage amplifier 42 at nodes N1 and N2. Power supply noise due to first stage amplifier 42 is canceled or reduced because the power supply noise affects both outputs of the first stage amplifier the same. Nodes N1 and N2 provide a relatively clean differential voltage to the gates of N-channel transistors 92 and 94 of second stage amplifier 44. Feed forward differential pair 46 includes N-channel transistors 64 and 66 having sources coupled together to receive a current through P-channel transistor 62. The current through P-channel transistor 62 is determined by the current mirror that includes P-channel transistor 52. N-channel transistors 64 and 66 have drains connected to second stage amplifier 44 at nodes N4 and N3, respectively.

Second stage amplifier 44 and the feed-forward differential pair 46 together provide a bias voltage to control the gate voltage of P-channel drive transistor 48. The conductivity of P-channel transistor 48 determines the voltage at output terminal VOUT. A voltage at feedback resistor network 50 is fed back to the gate of P-channel transistor 60 of differential pair 56. LDO regulator 40 attempts to adjust the bias voltage provided to the gate of P-channel transistor 60 to be equal to reference voltage VREF. Capacitor 102 is an output capacitor implemented outside of the integrated circuit and current sink 104 represents a time varying load current from a load coupled to receive output voltage VOUT.

Power supply noise is canceled in the first stage amplifier 42 because the power supply noise affects both of differential output nodes N1 and N2 of the first stage amplifier 42 the same way. Therefore, the power supply rejection ratio is improved. A pole at the output of first stage amplifier 42 is compensated for by a left half plane (LHP) zero determined by the input transconductances of the first stage amplifier 42, second stage amplifier 44, and feed-forward stage amplifier 46 and the parasitic output impedances of the first stage amplifier 42. The output of second stage amplifier 44 biases the gate of drive P-channel transistor 48. LDO regulator circuit 10 attempts to make the feedback voltage from feedback resistor network 50 to be the same level as the reference voltage VREF. Feed-forward input stage 46 is connected in parallel with the first and second stage amplifiers 42 and 44, respectively, and stabilizes the bias voltage provided to the gate of P-channel transistor 48. In another embodiment, Miller compensation may be used instead of the feed forward amplification. However, feed-forward input stage 46 provides the advantage of improved transient response and reduced output voltage glitches and settling time due to higher gain-bandwidth as compared to Miller compensation for a given phase margin.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
    a first stage amplifier having a first input coupled to receive a reference voltage, a second input, a first output, and a second output;
    a second stage amplifier having a first input coupled to the first output of the first stage amplifier, a second input coupled to the second output of the first stage amplifier, and an output;
    a feed-forward amplifier having a first input coupled to receive the reference voltage, a second input, and an output coupled to the output of the second stage amplifier;
    a transistor having a control terminal coupled to the output of the second stage amplifier and to the output of the feed-forward amplifier, a first current terminal coupled to an output voltage terminal and a second current terminal coupled to a first voltage supply;
    a first resistive element having a first terminal coupled to the output voltage terminal and a second terminal coupled to the second input of the first stage amplifier and to the second input of the feed-forward amplifier; and a second resistive element having a first terminal coupled to the second terminal of the first resistive element and a second terminal coupled to a second voltage supply.

2. The circuit of claim 1, wherein the first stage amplifier is characterized as a fully differential operational amplifier having a differential input, a differential output, and a common-mode feedback circuit.

3. The circuit of claim 2, wherein the common-mode feedback circuit further comprises:
a first resistor having a first terminal and a second terminal, the first terminal coupled to the first output of the first stage amplifier; and
a second resistor having a first terminal and a second terminal, the first terminal coupled to the second output of the first stage amplifier;
wherein the second terminal of the first resistor is coupled to the second terminal of the second resistor and coupled to a current source in the output stage of the first stage amplifier.

4. The circuit of claim 1, wherein the second stage amplifier is characterized as a differential operational amplifier having a differential input and a single ended output.

5. The circuit of claim 1, further comprising a current load coupled between the output voltage terminal and the second voltage supply.

6. The circuit of claim 1, further comprising a capacitor having a first terminal coupled to the output voltage terminal and a second terminal coupled to the second voltage supply.

7. The circuit of claim 1, wherein the first voltage supply is characterized as a positive power supply voltage and the second voltage supply is characterized as ground.

8. The circuit of claim 1, wherein the feed-forward amplifier is characterized as an operational amplifier having a differential input and a single ended output.

9. The circuit of claim 1, wherein the second stage amplifier and the feed-forward amplifier share a common output stage.

10. The circuit of claim 1, wherein the transistor is a P-channel transistor.

11. The circuit of claim 1, further comprising a bias circuit for providing a bias voltage to the first stage amplifier, the second stage amplifier, and the feed-forward amplifier.

12. The circuit of claim 1, wherein the first resistive element includes a first plurality of series-connected resistors and the second resistive element includes a second plurality of series-connected resistors.

13. A circuit comprising:
a first stage amplifier having a first input coupled to receive a reference voltage, a second input, a first output, and a second output;
a second stage amplifier having a first input coupled to the first output of the first stage amplifier, a second input coupled to the second output of the first stage amplifier, and an output;
a transistor having a control terminal coupled to the output of the second stage amplifier, a drain terminal coupled to an output voltage terminal and a source terminal coupled to a first voltage supply;
a first resistive element having a first terminal coupled to the output voltage terminal and a second terminal coupled to the second input of the first stage amplifier; and a second resistive element having a first terminal coupled to the second terminal of the first resistive element and a second terminal coupled to a second voltage supply.

14. The circuit of claim 13, further comprising a feed-forward amplifier having a first input coupled to receive the reference voltage, a second input coupled to second terminal of the first resistive element, and an output coupled to the output of the second stage amplifier.

15. The circuit of claim 14, wherein a pole at the output of the first stage amplifier is compensated for by a left half plane zero determined by input transconductances of the first stage amplifier, the second stage amplifier, the feed-forward amplifier and a parasitic output impedance of the first output and the second output of the first stage amplifier.

16. The circuit of claim 13, wherein the first resistive element includes a first plurality of series-connected resistors and the second resistive element includes a second plurality of series-connected resistors.

17. The circuit of claim 13, wherein the first stage amplifier is characterized as a fully differential operational amplifier having a differential input, a differential output, and a common-mode feedback circuit.

18. The circuit of claim 17, wherein the common-mode feedback circuit further comprises:
a first resistor having a first terminal and a second terminal, the first terminal coupled to the first output of the first stage amplifier; and
a second resistor having a first terminal and a second terminal, the first terminal coupled to the second output of the first stage amplifier;
wherein the second terminal of the first resistor is coupled to the second terminal of the second resistor and coupled to a current source in the output stage of the first stage amplifier.

19. A method of regulating an output voltage comprising:
receiving a reference voltage at a first input of a first stage amplifier, the first stage amplifier having a second input, and providing a differential output;
receiving the differential output of the first stage amplifier at differential inputs of a second stage amplifier, the second stage amplifier providing a single-ended output voltage;
receiving the second stage amplifier output voltage at a control terminal of a transistor, the transistor having a first terminal coupled to a first voltage supply and at a second terminal providing an output voltage based on the control terminal voltage and the first voltage supply; and
feeding back a feedback voltage to the second input of the first stage amplifier, the feedback voltage being relative to the output voltage at the second terminal of the transistor.

20. The method of claim 19, further comprising:
receiving the reference voltage at a first input of a feed-forward amplifier;
receiving the feedback voltage at a second input of the feed-forward amplifier; and
coupling an output of the feed-forward amplifier with an output of the second stage amplifier.

* * * * *